United States Patent
Koike et al.

(10) Patent No.: US 8,685,530 B2
(45) Date of Patent: Apr. 1, 2014

(54) SURFACE-COATED CUTTING TOOL

(75) Inventors: Sachiko Koike, Itami (JP); Shinya Imamura, Itami (JP); Kazuo Yamagata, Itami (JP)

(73) Assignee: Sumitomo Electric Hardmetal Corp., Itami-shi, Hyogo (JP)

( * ) Notice: Subject to any disclaimer, the term of this patent is extended or adjusted under 35 U.S.C. 154(b) by 386 days.

(21) Appl. No.: 13/202,047

(22) PCT Filed: Dec. 3, 2010

(86) PCT No.: PCT/JP2010/071704
§ 371 (c)(1),
(2), (4) Date: Aug. 17, 2011

(87) PCT Pub. No.: WO2011/077928
PCT Pub. Date: Jun. 3, 2011

(65) Prior Publication Data
US 2012/0021199 A1 Jan. 26, 2012

(30) Foreign Application Priority Data
Dec. 21, 2009 (JP) ................................ 2009-288849

(51) Int. Cl.
*B23B 27/14* (2006.01)

(52) U.S. Cl.
USPC ............... 428/216; 51/307; 51/309; 428/336; 428/697; 428/698; 428/699; 428/701; 428/702; 428/704

(58) Field of Classification Search
USPC ............ 51/307, 309; 428/216, 336, 697, 698, 428/699, 701, 702, 704
See application file for complete search history.

(56) References Cited

U.S. PATENT DOCUMENTS

| | | | | |
|---|---|---|---|---|
| 7,357,975 | B2 * | 4/2008 | Vetter ............................ | 428/216 |
| 8,211,554 | B2 * | 7/2012 | Fontaine et al. .............. | 428/699 |
| 8,440,328 | B2 * | 5/2013 | Inspektor et al. ............. | 428/697 |
| 2004/0115484 | A1 | 6/2004 | Horling et al. | |
| 2005/0129986 | A1 | 6/2005 | Sata et al. | |
| 2006/0222893 | A1 | 10/2006 | Derflinger | |
| 2006/0246320 | A1 | 11/2006 | Kathrein et al. | |

FOREIGN PATENT DOCUMENTS

| | | |
|---|---|---|
| CN | 1578710 A | 2/2005 |
| CN | 1675015 A | 9/2005 |
| CN | 1853832 A | 11/2006 |
| JP | 06-122959 A | 5/1994 |
| JP | 2003-39210 A | 2/2003 |
| JP | 2005-271133 A | 10/2005 |
| JP | 2005-297142 A | 10/2005 |
| JP | 2005-297143 A | 10/2005 |
| JP | 2006-26783 A | 2/2006 |
| JP | 2006-175569 * | 7/2006 |
| WO | WO 03/037554 A1 | 5/2003 |
| WO | WO 03/085152 A2 | 10/2003 |
| WO | WO 2004/000494 A1 | 12/2003 |
| WO | WO 2011/077928 A1 | 6/2011 |

OTHER PUBLICATIONS

International Search Report for PCT/JP2010/071704, Feb. 1, 2011, pp. 1-3.
Kalss et al., "Modern coatings in high performance cutting applications," International Journal of Refractory Metals & Hard Metals, 2006, vol. 24, p. 399-404.
Kalss et al., "Modern coatings in high performance cutting applications," International Journal of Refractory Metals & Hard Materials, 2006, vol. 24, p. 399-404.
European Supplementary Search Report for related European Application No. 10 83 9162 dated Jun. 15, 2012, pp. 1-5.
Office Action for related Chinese Patent Application No. 20108008184.6 dated Jan. 4, 2013, pp. 1-12.

* cited by examiner

*Primary Examiner* — Archene Turner
(74) *Attorney, Agent, or Firm* — Ditthavong Mori & Steiner, P.C.

(57) ABSTRACT

Provided is a surface-coated cutting tool combining superior heat resistance, superior wear resistance, and superior lubricity. A surface-coated cutting tool of the present invention includes a substrate and a coating formed on the substrate, and the coating is characterized in that the coating is formed by physical vapor deposition and includes one or more layers, that at least one of the one or more layers is a first coating layer, and that the first coating layer contains aluminum and nitrogen, has a thermal effusivity of 2,000 to 5,000 $J \cdot sec^{-1/2} \cdot m^{-2} \cdot K^{-1}$, has a thickness of 0.2 to 5 μm, and has a crystal structure including a hexagonal structure.

20 Claims, No Drawings

SURFACE-COATED CUTTING TOOL

TECHNICAL FIELD

The present invention relates to surface-coated cutting tools including substrates and coatings formed on the substrates.

BACKGROUND ART

As a recent trend in cutting tools, the cutting edge temperature of the tools has been becoming increasingly higher for reasons including the demand for dry machining without the use of a cutting lubricant from the viewpoint of global environmental conservation, diversified workpieces, and increased cutting speeds for higher machining efficiency. Accordingly, the properties required of tool materials have been becoming stricter. As the properties required of tool materials, particularly, not only the heat resistance of a coating formed on a substrate, but also the improvement in wear resistance and the lubrication performance of the coating to replace a lubricant, which are related to the lives of cutting tools, have been becoming more important.

For improvements in the heat dissipation, lubricity, and chipping resistance of the coating, a technique is well known that forms a coating of AlN on the surface of a cutting tool formed of a hard substrate such as a WC-based cemented carbide, a cermet, or a high-speed steel. AlN, which has high thermal conductivity, can improve the heat dissipation of the coating and does not trap heat in itself In addition, AlN features high lubricity with low hardness. This feature gives AlN the advantage of preventing abnormal tool wear and improving the chipping resistance.

Having such various advantages, AlN is almost an essential material for achieving a balance between the lubricity and chipping resistance of cutting tools at a high level. Accordingly, AlN has been used in various ways. PTL 1, for example, discloses a technique that uses AlN in a hexagonal crystal state for the outermost surface. PTL 2 discloses a technique that forms a compound layer containing aluminum and one or more elements selected from the group consisting of nitrogen, oxygen, and carbon by physical vapor deposition. Similarly, PTL 3 discloses a technique that uses AlN for the surface of a coating. Thus, a coating of AlN can be formed on the outermost surface to improve the heat dissipation, lubricity, and chipping resistance of that surface.

However, all of the coatings of AlN disclosed in PTL 1 to 3 cause a heat crack in the tool substrate because they quickly transfer heat generated during cutting to the tool substrate (through a lower layer if any) due to the high thermal effusivity of AlN. This results in the problem of a shortened tool life. In addition, all of the coatings of AlN disclosed in PTL 1 to 3 have an insufficient lubrication effect because they wear quickly due to their insufficient hardness.

As an attempt to further improve the lubricity, on the other hand, PTL 4 discloses a technique that adds chlorine to an outermost coating of AlN to improve the lubricity of the outermost surface of the coating. In addition, PTL 5 discloses a technique that improves the thermal insulation and lubricity of the surface of the coating by forming TiCN and TiCNO layers on the substrate side of the coating and forming an $Al_2O_3$ layer, which has high heat resistance, and an AlN layer, which has high lubricity, on the outermost side of the coating.

CITATION LIST

Patent Literature

PTL 1: Japanese Unexamined Patent Application Publication No. 2005-271133

PTL 2: Japanese Unexamined Patent Application Publication No. 2005-297143

PTL 3: Japanese Unexamined Patent Application Publication No. 2006-026783

PTL 4: Japanese Unexamined Patent Application Publication No. 2005-297142

PTL 5: Japanese Unexamined Patent Application Publication No. 2003-039210

SUMMARY OF INVENTION

Technical Problem

However, none of the techniques in PTL 4 and 5 can solve the problem of the low surface hardness of the coating; the outermost surface of the coating tends to be quickly lost due to wear.

Thus, the technique of improving the lubricity of the surface of the coating by forming an AlN layer on the surface side of the coating has often been used. In addition, an AlN layer formed on the outermost side of the coating is expected to improve the wear resistance with its lubrication effect; however, a surface-coated cutting tool that sufficiently exhibits that effect has yet to be provided.

An object of the present invention, which has been made in light of the current circumstances described above, is to provide a surface-coated cutting tool combining superior heat resistance, superior wear resistance, and superior lubricity by forming a first coating layer containing aluminum and nitrogen and having low thermal effusivity and high hardness on a substrate.

Solution to Problem

A surface-coated cutting tool of the present invention includes a substrate and a coating formed on the substrate, and the coating is characterized in that the coating is formed by physical vapor deposition and includes one or more layers, that at least one of the one or more layers is a first coating layer, and that the first coating layer contains aluminum and nitrogen, has a thermal effusivity of 2,000 to 5,000 $J \cdot sec^{-1/2} \cdot m^{-2} \cdot K^{-1}$, has a thickness of 0.2 to 5 μm, and has a crystal structure including a hexagonal structure.

The first coating layer is preferably an outermost layer of the coating.

The first coating layer preferably has a hardness of 2,500 to 3,800 mgf/μm².

The first coating layer preferably has a residual stress of −1 to 0 GPa, and is preferably formed by sputtering.

The first coating layer is preferably formed of $Al_{1-x}Me_xN$ (0.001 ≤ x ≤ 0.2), where Me is one or more elements selected from the group consisting of vanadium, chromium, yttrium, niobium, hafnium, tantalum, boron, and silicon.

The coating preferably includes one or more second coating layers in addition to the first coating layer, and the second coating layers are preferably formed of one or more elements selected from the group consisting of group IVa, Va, and VIa elements of the periodic table, aluminum, and silicon, or a compound of one or more of the elements with one or more elements selected from the group consisting of carbon, nitrogen, oxygen, and boron.

One or more of the second coating layers are preferably formed of one or more elements selected from the group consisting of chromium, aluminum, titanium, and silicon or a compound of one or more of the elements with one or more elements selected from the group consisting of carbon, nitrogen, oxygen, and boron.

The second coating layers preferably have a supermultilayer structure including periodically stacked thin-film layers having a thickness of 1 to 100 nm, and the thin-film layers are preferably formed of one or more elements selected from the group consisting of chromium, aluminum, titanium, and silicon or a compound of one or more of the elements with one or more elements selected from the group consisting of carbon, nitrogen, oxygen, and boron.

The substrate is preferably formed of a cemented carbide, a cermet, a sintered cubic boron nitride compact, a high-speed steel, a ceramic, or a sintered diamond compact.

Advantageous Effects of Invention

Having the structure described above, the surface-coated cutting tool of the present invention has the advantage of combining superior heat resistance, superior wear resistance, and superior lubricity.

DESCRIPTION OF EMBODIMENTS

Surface-Coated Cutting Tool

A surface-coated cutting tool of the present invention includes a substrate and a coating formed thereon. Having that basic structure, the surface-coated cutting tool of the present invention is significantly useful as, for example, a drill, an end mill, an indexable insert for milling or turning, a metal saw, a gear-cutting tool, a reamer, a tap, or an insert for crankshaft pin milling.

Substrate

As the substrate of the surface-coated cutting tool of the present invention, any substrate known as a substrate for such cutting tools can be used. Examples of such substrates include cemented carbides (e.g., WC-based cemented carbides, which contain cobalt in addition to WC, including those further containing, for example, titanium, tantalum, or niobium carbonitride), cermets (mainly containing, for example, TiC, TiN, or TiCN), high-speed steels, ceramics (e.g., titanium carbide, silicon carbide, silicon nitride, aluminum nitride, aluminum oxide, and mixtures thereof), sintered cubic boron nitride compacts, and sintered diamond compacts.

If a cemented carbide is used as the substrate, the advantages of the present invention are exhibited even if the cemented carbide has free carbon or an abnormal phase called the η phase in the structure thereof. The substrate may also have the surface thereof modified. For example, if a cemented carbide is used, it may have a β-free layer formed in the surface thereof, or if a cermet is used, it may have a surface-hardened layer formed therein; thus, the advantages of the present invention are exhibited even if the surface is modified.

Coating

The coating of the present invention is characterized in that the coating is formed by physical vapor deposition, that the coating includes one or more layers, that at least one of the one or more layers is a first coating layer, and that the first coating layer contains aluminum and nitrogen, has a thermal effusivity of 2,000 to 5,000 $J \cdot sec^{-1/2} \cdot m^{-2} \cdot K^{-1}$, and has a crystal structure including a hexagonal structure.

Here, the coating of the present invention may be formed such that the coating covers the entire surface of the substrate, such that the coating is partially absent, or such that part of the coating is formed in a different manner.

The coating of the present invention preferably has a total thickness of 1 to 30 µm. If the thickness of the coating falls below 1 µm, the coating may have poor wear resistance, whereas if the thickness exceeds 30 µm, the coating may be self-destroyed under a compressive stress remaining therein. The preferred thickness of the coating is 2 to 20 µm.

The coating of the present invention is formed by physical vapor deposition (PVD). The reason for employing physical vapor deposition in the present invention is that it is essential to form a coating having a dense structure as the coating formed on the surface of the substrate. Research on various deposition processes has revealed that a coating formed by physical vapor deposition is best suited.

The individual layers constituting the coating of the present invention will now be described in detail.

First Coating Layer

The first coating layer included in the coating of the present invention is characterized in that it contains aluminum and nitrogen and has a thermal effusivity of 2,000 to 5,000 $J \cdot sec^{-1/2} \cdot m^{-2} \cdot K^{-1}$. Known coatings containing aluminum and nitrogen are superior in terms of lubricity; however, they have a problem in that their high thermal effusivity tends to cause the other layers and the substrate to be heated to high temperatures, thus resulting in a shortened tool life due to heat damage.

The first coating layer of the present invention, which overcomes the disadvantage of known coatings containing aluminum and nitrogen, can improve the thermal insulation of known coatings containing aluminum and nitrogen without decreasing the lubricity thereof, thereby preventing the tool itself from being heated to high temperatures.

If the first coating layer, whose thermal effusivity falls within the above numerical range, is formed, it can inhibit heat generated during cutting from being transferred to the tool substrate, thus extending the tool life. The thermal effusivity of the first coating layer is preferably 3,500 $J \cdot sec^{-1/2} \cdot m^{-2} \cdot K^{-1}$ or less, more preferably 3,000 $J \cdot sec^{-1/2} \cdot m^{-2} \cdot K^{-1}$ or less.

If the thermal effusivity of the first coating layer falls below 2,000 $J \cdot sec^{-1/2} \cdot m^{-2} \cdot K^{-1}$, it traps excessive heat on the surface side thereof, thus causing problems such as deformation of AlN crystals themselves and decreased hardness. A thermal effusivity exceeding 5,000 $J \cdot sec^{-1/2} \cdot m^{-2} \cdot K^{-1}$ is undesirable because the substrate cannot be insulated from heat generated during cutting and is therefore heated to high temperatures, thus suffering deformation or a heat crack.

Here, the value used as the thermal effusivity of the first coating layer is a value measured on the basis of thermoreflectance.

The first coating layer of the present invention is characterized in that it has a total thickness of 0.2 to 5 µm. If the thickness of the first coating layer falls below 0.2 µm, the first coating layer may have poor heat resistance. If the thickness exceeds 5 µm, the first coating layer may be self-destroyed under a compressive stress remaining therein. The preferred thickness of the first coating layer is 0.5 to 2 µm.

In addition, the first coating layer is preferably the outermost layer of the coating. That is, the first coating layer is preferably formed on the outermost surface of the coating opposite the side in contact with the substrate (hereinafter also referred to as "surface side"). Thus, if the first coating layer is formed on the surface side of the coating, it can improve the heat resistance of the entire tool, thus improving the wear resistance of the surface-coated cutting tool. The hexagonal crystal structure can be identified by finding a peak attributed to the hexagonal AlN plane in X-ray diffraction (XRD) measurement.

If the first coating layer is formed as the outermost layer, it provides superior heat resistance and lubrication effect and can also inhibit abnormal wear. Accordingly, the cutting resistance during cutting is reduced. Thus, the surface-coated cutting tool of the present invention can significantly effectively prevent the tool itself from being thermally broken and can also reduce the cutting resistance to provide significantly superior wear resistance.

The first coating layer preferably has a hardness of 2,500 to 3,800 mgf/µm². If a first coating layer having such a high hardness is formed, it improves the wear resistance of the surface-coated cutting tool. The first coating layer more preferably has a hardness of 3,200 to 3,600 mgf/µm².

If the hardness of the first coating layer falls below 2,500 mgf/µm², the coating tends to wear easily because of the insufficient hardness of the coating. If the hardness of the first coating layer exceeds 3,800 mgf/µm², the coating tends to wear easily because of the decreased lubricity of the coating. As used herein, the "hardness" refers to indentation hardness, for which a value measured using a nanoindenter (manufactured by Elionix Inc.) is used.

Residual Stress

The first coating layer preferably has a residual stress of −1 to 0 GPa. With such a residual stress, the first coating layer can effectively exhibit the property of not being broken during the formation thereof or during cutting with superior fracture resistance.

Thus, if the residual stress of the entire first coating layer is a small compressive residual stress, it improves the peeling resistance of the coating. In addition, the resistance to breakage due to an impact is improved. This enhances the effect of extending the tool life. The residual stress of the entire first coating layer is more preferably −0.8 to −0.2 GPa.

If the residual stress of the first coating layer falls below −1 GPa, the first coating layer tends to suffer a compressive failure, whereas if the residual stress of the first coating layer exceeds 0 GPa, the coating tends to be broken upon impact.

Here, the above numerical range of residual stress means that the average of the residual stress of the entire first coating layer is −1 to 0 GPa. Even if the residual stress of the entire first coating layer deviates from the above numerical range locally at some positions, it can improve the peeling resistance and toughness of the coating as long as the average falls within that numerical range.

In addition, the "residual stress" refers to the average residual stress of the entire coating, which can be measured by the $\sin^2 \psi$ method as below. The $\sin^2 \psi$ method, which uses X-rays, is widely used as a method for measuring the residual stress of polycrystalline materials. This measurement method is described in detail in "X-Sen Oryoku Sokuteiho (X-ray Stress Measurement Method)" (The Society of Materials Science, Japan, published by Yokendo Co., Ltd., 1981), pages 54 to 66. In the present invention, first, the depth of penetration of an X-ray is fixed by combining the iso-inclination method and the side-inclination method, and the diffraction angle 2θ is measured in various ψ directions in a plane including the direction of the stress to be measured and the normal to the surface of the sample at a measurement position to create a $2\theta\text{-}\sin^2 \psi$ graph whose gradient is used to determine the average of the residual stress to that depth (distance from the surface of the coating).

More specifically, in an X-ray stress measurement method in which an X-ray from an X-ray source is incident on a sample at a predetermined angle and the X-ray diffracted by the sample is detected by an X-ray detector to measure the internal stress on the basis of the value detected, the internal residual stress of the sample (namely, the coating) can be determined by making the X-ray from the X-ray source incident at any position on the surface of the sample at any preset angle and measuring diffraction lines with varying angles ψ between the normal to the diffraction plane and the normal to the surface of the sample while rotating the sample about the ω axis, which passes through the point irradiated with the X-ray on the sample and which is perpendicular to the incident X-ray in the surface of the sample, and about the χ axis, on which the ω axis coincides with the incident X-ray as the ω axis is rotated parallel to the sample stage, such that the angle between the surface of the sample and the incident X-ray remains constant.

The X-ray source used above is preferably synchrotron radiation (SR) in terms of the quality of the X-ray source (such as high luminance, high parallelism, and wavelength tunability).

In addition, the Young's modulus and Poisson's ratio of the coating are needed to determine the residual stress from a 2θ-sin 2ψ graph as above. The Young's modulus can be measured using, for example, a dynamic hardness tester. As the Poisson's ratio, which does not vary greatly with the type of material, a value around 0.2 may be used.

On the other hand, as used herein, the compressive stress (compressive residual stress) is a type of internal stress (inherent strain) present in the coating and is expressed as a negative value (unit: GPa). On the other hand, as used herein, the tensile stress (tensile residual stress) is also a type of internal stress present in the coating and is expressed as a positive value (unit: GPa). Because the compressive stress and the tensile stress are both internal stresses remaining in the coating, they are also collectively referred to as the residual stress (including 0 GPa for convenience).

A first coating layer whose residual stress falls within that range can be formed by adjusting the amount of kinetic energy of atoms or ions striking the substrate to form the first coating layer in physical vapor deposition. In general, the larger the amount of kinetic energy, the larger absolute value the resulting compressive residual stress has. The details of physical vapor deposition will be described later.

Addition of Other Elements

The compound forming the first coating layer of the present invention (i.e., a compound containing aluminum and nitrogen) preferably contains at least one element selected from the group consisting of vanadium, chromium, yttrium, niobium, hafnium, tantalum, boron, and silicon, and the proportion thereof is preferably 0.1 to 20 atomic percent relative to the amount of metal component contained in the compound (i.e., aluminum). That is, the first coating layer is preferably formed of $Al_{1-x}Me_xN$ ($0.001 \leq x \leq 0.2$), where Me is one or more elements selected from the group consisting of vanadium, chromium, yttrium, niobium, hafnium, tantalum, boron, and silicon. If the first coating layer contains such other elements, they strain the crystal structure in the first coating layer to further improve the hardness, thus further improving the wear resistance. In addition, these elements inhibit atomic diffusion in the coating or between the coating and the substrate during cutting to improve the resistance to a reaction such as oxidation.

If the atomic ratio of Me falls below 0.1 atomic percent, the effect of improving the hardness is not achieved because the crystal structure in the first coating layer is not changed. If the atomic ratio of Me exceeds 20 atomic percent, the first coating layer may be self-destroyed because the crystal structure in the first coating layer is excessively strained.

If the first coating layer is formed by physical vapor deposition using a target containing such other elements in desired amounts as the source material of the first coating layer, they can be contained in the compound forming the layer. The other elements may be contained either interstitially or substitutionally.

Second Coating Layer

In the present invention, the coating preferably includes one or more second coating layers in addition to the first coating layer described above. The second coating layers may be formed between the substrate and the first coating layer as an intermediate layer or may be formed on the surface side of the first coating layer as the outermost layer.

The second coating layers of the present invention preferably have a total thickness of 1 to 25 µm. If the thickness of the second coating layers falls below 1 µm, the second coating layers may have poor wear resistance. If the thickness exceeds 25 µm, the coating may be self-destroyed under a compressive stress remaining in the second coating layers. The preferred thickness of the second coating layers is 1.8 to 20 µm.

Here, the second coating layers are preferably formed of one or more elements selected from the group consisting of group IVa, Va, and VIa elements of the periodic table, aluminum, and silicon, or a compound of one or more of the elements with one or more elements selected from the group consisting of carbon, nitrogen, oxygen, and boron. If nitrogen is contained together with the former elements, the second coating layers have superior toughness and therefore have an advantage in that the coating is not readily broken when formed as a thick film. If carbon and nitrogen are contained, they can improve the crater resistance. In addition, oxygen is preferably contained because it provides superior oxidation resistance and welding resistance. If the second coating layers contain aluminum and nitrogen, the second coating layers have substantially the same composition as the first coating layer, although they differ from the first coating layer in at least one of thermal effusivity, thickness, and crystal structure.

The above second coating layers may have either a single-layer structure or a multilayer structure. A multilayer structure is preferable in view of imparting various functions, and in particular, of multilayer structures, a supermultilayer structure is more preferable. Here, the "multilayer structure" refers to a multiple layer including two or more layers, and the "supermultilayer structure" refers to a stack of about 100 to 10,000 layers of two or more types having different properties and compositions, each having a thickness of several nanometers to several hundreds of nanometers (typically, stacked alternately or repeatedly on top of each other).

One or more of the second coating layers are preferably formed of one or more elements selected from the group consisting of chromium, aluminum, titanium, and silicon or a compound of one or more of the elements with one or more elements selected from the group consisting of carbon, nitrogen, oxygen, and boron.

The second coating layers preferably have a supermultilayer structure including periodically stacked thin-film layers having a thickness of 1 to 100 nm. The thin-film layers are more preferably formed of one or more elements selected from the group consisting of chromium, aluminum, titanium, and silicon or a compound of one or more of the elements with one or more elements selected from the group consisting of carbon, nitrogen, oxygen, and boron. If the second coating layers have a supermultilayer structure, the deposition rate is higher because different targets are used and the thickness of the layers is on the order of several nanometers. In addition, layers having different properties and compositions can be combined to improve the film properties, including the hardness, thermal insulation, oxidation resistance, and toughness of the coating.

Production Process

As the physical vapor deposition (PVD) process used for forming the coating of the present invention, any known physical vapor deposition process can be used. It is essential to use a deposition process that allows formation of a highly crystalline compound in order to deposit the coating of the present invention on the surface of the substrate. Research on various deposition processes has revealed that the use of physical vapor deposition is best suited. Examples of physical vapor deposition processes include sputtering, ion plating, arc ion plating, and electron/ion beam deposition; in particular, cathode arc ion plating, where the source elements are ionized at a high rate, or sputtering is preferably used because they provide high productivity.

Among physical vapor deposition processes, the first coating layer is preferably formed by sputtering. If the first coating layer is formed by sputtering, the first coating layer has a homogeneous crystal structure. This provides the advantage of increasing the hardness of the first coating layer. The specific conditions for sputtering are exemplified as follows.

Specifically, pulsed sputtering is used for alternate application of high-frequency pulses and low-frequency pulses. The target used is a sintered or fused target having the target composition. A pulse frequency of 100 kHz or less and a pulse frequency of 300 kHz or more are alternately applied to the sputter cathode by controlling the pulse frequency each time a thickness of 20 to 70 nm is reached.

In this way, varying pulse frequencies can be alternately applied to adjust the energy of particles coming from the target. That is, as the proportion of a pulse frequency of 300 kHz or more is increased, the crystals of the first coating layer grow more three-dimensionally, and accordingly the hardness increases; as the proportion of a pulse frequency of 100 kHz or less is increased, the growth of the crystals of the first coating layer is retarded, and accordingly the hardness tends to decrease. Thus, these pulse frequencies can be appropriately controlled to retard the crystal growth of the first coating layer while keeping it highly crystalline, thus forming a first coating layer with a uniform crystal structure.

When the pulse frequency applied to the sputter cathode is controlled to 100 kHz or less, the bias applied to the substrate preferably has a frequency of 200 kHz or more and a bias voltage to 50 V or more. When the pulse frequency applied to the sputter cathode is controlled to 300 kHz or more, the bias applied to the substrate preferably has a frequency of 100 kHz or less and a bias voltage to less than 50 V. In this way, the bias applied to the substrate can be adjusted to form a first coating layer with a dense crystal structure, thus improving the thermal insulation of the coating.

EXAMPLES

The present invention will be described in more detail with reference to the examples below, although the invention is not limited thereto. The thickness of the coatings and the individual layers in the examples was measured by examining cross sections of the coatings using a scanning electron microscope (SEM) or a transmission electron microscope (TEM), and the composition of the compounds forming the individual layers in the examples was examined by X-ray photoelectron spectroscopy (XPS). In addition, the crystal structure was examined by X-ray diffraction (XRD), where the measurement was carried out at an incident angle of 0.5°. In addition, the residual stress of the entire coatings was measured by the $\sin^2 \psi$ method described above, and the hardness was measured using a nanoindenter (manufactured by Elionix Inc.). Furthermore, the thermal effusivity was measured by thermoreflectance in an environment with a test temperature of 24° C. and a test humidity of 30% using a thermal microscope (Thermal Microscope TM3 (manufactured by BETHEL Co., Ltd.)) in the point measurement mode in combination with a detection laser having a measurement frequency of 3 MHz.

Examples 1 to 56 and Comparative Examples 1 to 14

Surface-coated cutting tools were produced and evaluated as follows.
Production of Surface-Coated Cutting Tools In Examples 1 to 28 and Comparative Examples 1 to 7, first, as substrates of surface-coated cutting tools for face milling, substrates formed of a P20 cemented carbide and having the shape of SDEX42MT (JIS) were prepared. As substrates of surface-coated cutting tools for turning, substrates formed of a P20 cemented carbide and having the shape of CNMG120408 (JIS) were prepared. These substrates were set to a cathode arc ion plating/sputtering apparatus.

In Examples 29 to 56 and Comparative Examples 8 to 14, on the other hand, as substrates of surface-coated cutting tools for face milling, substrates formed of a P20 cemented carbide and having the shape of SEET13T3AGSN (JIS) were prepared. As substrates of surface-coated cutting tools for turning, substrates formed of a K20 cemented carbide and having the shape of CNMG120408 (JIS) were prepared. These substrates were set to a cathode arc ion plating/sputtering apparatus or CVD apparatus.

Subsequently, the internal pressure of a chamber of the apparatus was reduced by a vacuum pump while the substrate temperature was raised to 600° C. by a heater installed in the apparatus, the chamber being evacuated until the internal pressure was reduced to $1.0 \times 10^{-4}$ Pa.

Next, the surfaces of the substrates were cleaned for 30 minutes by gradually raising the voltage of the substrate bias power supply for the substrates to $-1,500$ V to heat a tungsten filament so that it emitted thermal electrons while introducing argon gas into the chamber so as to maintain the internal pressure at 3.0 Pa. The argon gas was discharged thereafter.

Then, the intermediate layers shown in Tables I to IV were formed directly on the substrates in the order of the first, second, and third layers. The symbol "-" in the tables means that no corresponding layer was formed. The intermediate layers were deposited by a known method using sintered or fused targets having the target compositions, that is, the metal compositions of the intermediate layers shown in Tables I to IV, while introducing Ar, $N_2$, $CH_4$, and $O_2$ gases.

TABLE I

| | | Intermediate layer | | | | First coating layer | | |
| | | First layer | | Second layer | | | | Thermal | |
| | | Composition | Thickness (μm) | Composition | Thickness (μm) | Composition | Production process | effusivity ($J \cdot sec^{-1} \cdot m^{-1} \cdot K^{-1}$) | Crystal structure |
|---|---|---|---|---|---|---|---|---|---|
| Example | 1 | $Ti_{0.5}Al_{0.5}N$ | 3 | — | — | AlN | AIP | 4800 | Hexagonal |
| | 2 | $Ti_{0.5}Al_{0.5}N$ | 3 | — | — | AlN | AIP | 4200 | Hexagonal |
| | 3 | $Ti_{0.5}Al_{0.5}N$ | 3 | — | — | AlN | SP | 3500 | Hexagonal |
| | 4 | $Ti_{0.5}Al_{0.5}N$ | 3 | — | — | AlN | SP | 3200 | Hexagonal |
| | 5 | $Ti_{0.5}Al_{0.5}N$ | 3 | — | — | AlN | SP | 3100 | Hexagonal |
| | 6 | $Ti_{0.5}Al_{0.5}N$ | 3 | — | — | AlN | SP | 2700 | Hexagonal |
| | 7 | $Ti_{0.5}Al_{0.5}N$ | 3 | — | — | AlN | SP | 2500 | Hexagonal |
| | 8 | $Ti_{0.5}Al_{0.5}N$ | 3 | — | — | AlN | SP | 2400 | Hexagonal |
| | 9 | $Ti_{0.5}Al_{0.5}N$ | 3 | — | — | AlN | SP | 2100 | Hexagonal |
| | 10 | $Ti_{0.5}Al_{0.5}N$ | 3 | — | — | AlN | SP | 2400 | Hexagonal |
| | 11 | $Ti_{0.5}Al_{0.5}N$ | 3 | — | — | AlN | SP | 2400 | Hexagonal |
| | 12 | $Ti_{0.5}Al_{0.5}N$ | 3 | — | — | AlN | SP | 2400 | Hexagonal |
| | 13 | $Ti_{0.5}Al_{0.5}N$ | 3 | — | — | AlN | SP | 2400 | Hexagonal |
| | 14 | $Ti_{0.5}Al_{0.5}N$ | 3 | — | — | $Al_{0.94}Cr_{0.06}N$ | SP | 2600 | Hexagonal |
| | 15 | $Ti_{0.5}Al_{0.5}N$ | 3 | — | — | $Al_{0.98}V_{0.02}N$ | SP | 2200 | Hexagonal |
| | 16 | $Ti_{0.5}Al_{0.5}N$ | 3 | — | — | $Al_{0.97}V_{0.03}N$ | SP | 2400 | Hexagonal |
| | 17 | $Ti_{0.5}Al_{0.5}N$ | 3 | — | — | $Al_{0.95}Si_{0.05}N$ | SP | 2000 | Hexagonal |
| | 18 | $Ti_{0.5}Al_{0.5}N$ | 3 | — | — | $Al_{0.92}Ta_{0.08}N$ | SP | 2400 | Hexagonal |
| | 19 | $Ti_{0.5}Al_{0.5}N$ | 3 | — | — | $Al_{0.99}Hf_{0.01}N$ | SP | 2300 | Hexagonal |
| | 20 | $Ti_{0.5}Al_{0.5}N$ | 3 | — | — | $Al_{0.93}Y_{0.07}N$ | SP | 2100 | Hexagonal |
| | 21 | $Ti_{0.5}Al_{0.5}N$ | 3 | — | — | $Al_{0.93}B_{0.07}N$ | SP | 2400 | Hexagonal |
| | 22 | TiN | 0.5 | $Ti_{0.9}Si_{0.07}N$ | 2.5 | AlN | SP | 2100 | Hexagonal |
| | 23 | $Ti_{0.5}Al_{0.5}N$ | 0.5 | $Al_{0.7}Cr_{0.3}N$ | 2.5 | AlN | SP | 2000 | Hexagonal |
| | 24 | TiN | 0.3 | $Al_{0.47}Cr_{0.45}Si_{0.08}N$ | 2.5 | AlN | SP | 2100 | Hexagonal |
| | 25 | $Ti_{0.5}Al_{0.5}N$ | 0.5 | $Ti_{0.3}Al_{0.7}N$ (8 nm)/ TiN(7 nm) | 2.5 | AlN | SP | 2100 | Hexagonal |
| | 26 | $Ti_{0.5}Al_{0.5}N$ | 0.5 | $Ti_{0.5}Al_{0.5}N$ (6 nm)/ $Al_{0.7}Cr_{0.3}N$ (7 nm) | 2.5 | AlN | SP | 2100 | Hexagonal |
| | 27 | TiN | 0.3 | $Ti_{0.47}Al_{0.47}Si_{0.05}N$ (7 nm) | 2.5 | AlN | SP | 2100 | Hexagonal |
| | 28 | TiN | 0.3 | $Ti_{0.47}Al_{0.47}Si_{0.05}N$ (7 nm) | 2.5 | $Al_{0.93}Cr_{0.07}N$ | SP | 2500 | Hexagonal |

| | | First coating layer | | | Outermost layer | | | | |
| | | | | Residual | First layer | | Second layer | | Total |
| | | Thickness (μm) | Hardness (mgf/μm) | stress (GPa) | Composition | Thickness (μm) | Composition | Thickness (μm) | thickness (μm) |
|---|---|---|---|---|---|---|---|---|---|
| Example | 1 | 1.3 | 1800 | −1.5 | TiN | 0.2 | — | — | 4.5 |
| | 2 | 1.2 | 2000 | −0.9 | TiN | 0.2 | — | — | 4.4 |
| | 3 | 1.1 | 2500 | −0.8 | TiN | 0.2 | — | — | 4.3 |
| | 4 | 0.9 | 2800 | −0.1 | TiN | 0.2 | — | — | 4.1 |

TABLE I-continued

| | | | | | | | | | |
|---|---|---|---|---|---|---|---|---|---|
| | 5 | 1 | 3000 | −0.6 | TiN | 0.2 | — | — | 4.2 |
| | 6 | 1.3 | 3200 | −0.5 | TiN | 0.2 | — | — | 4.5 |
| | 7 | 1.3 | 3700 | −0.2 | TiN | 0.2 | — | — | 4.5 |
| | 8 | 1 | 3300 | −0.4 | TiN | 0.2 | TiCN | 0.1 | 4.3 |
| | 9 | 1.2 | 3500 | −0.6 | TiN | 0.2 | TiCN | 0.1 | 4.5 |
| | 10 | 1.9 | 3300 | −0.4 | TiN | 0.2 | TiCN | 0.1 | 5.2 |
| | 11 | 2.4 | 3300 | −0.3 | TiN | 0.2 | TiCN | 0.1 | 5.7 |
| | 12 | 4 | 3300 | −0.6 | TiN | 0.2 | — | — | 7.2 |
| | 13 | 4.8 | 3300 | −0.4 | TiN | 0.2 | — | — | 8 |
| | 14 | 0.9 | 3600 | −0.4 | TiN | 0.2 | — | — | 4.1 |
| | 15 | 1.1 | 3300 | −0.4 | TiN | 0.2 | — | — | 4.3 |
| | 16 | 1.1 | 3400 | −0.4 | TiN | 0.2 | — | — | 4.3 |
| | 17 | 1 | 3000 | −0.4 | TiN | 0.2 | — | — | 4.2 |
| | 18 | 1.2 | 3300 | −0.4 | TiN | 0.2 | — | — | 4.4 |
| | 19 | 1 | 3200 | −0.4 | TiN | 0.2 | — | — | 4.2 |
| | 20 | 1 | 3000 | −0.4 | TiN | 0.2 | — | — | 4.2 |
| | 21 | 1.1 | 2800 | −0.4 | TiN | 0.2 | — | — | 4.3 |
| | 22 | 1.2 | 3500 | −0.6 | TiN | 0.2 | TiCN | 0.1 | 4.5 |
| | 23 | 1.2 | 3500 | −0.6 | TiN | 0.2 | TiCN | 0.1 | 4.5 |
| | 24 | 1.2 | 3600 | −0.6 | TiN | 0.2 | TiCN | 0.1 | 4.3 |
| | 25 | 1.2 | 3500 | −0.6 | TiN | 0.2 | TiCN | 0.1 | 4.5 |
| | 26 | 1.2 | 3400 | −0.3 | TiN | 0.2 | TiCN | 0.1 | 4.5 |
| | 27 | 1.2 | 3600 | −0.7 | TiN | 0.2 | TiCN | 0.1 | 4.3 |
| | 28 | 1 | 3200 | −0.4 | TiN | 0.2 | TiCN | 0.1 | 4.1 |

TABLE II

| | | Intermediate layer | | First coating layer | | | | | | | Outermost layer | | Total |
|---|---|---|---|---|---|---|---|---|---|---|---|---|---|
| | | Composition | Thickness (μm) | Composition | Production process | Thermal effusivity (J·sec$^{-1}$·m$^{-1}$·K$^{-1}$) | Crystal structure | Thickness (μm) | Hardness (mgf/μm) | Residual stress (Gpa) | Composition | Thickness (μm) | thickness (μm) |
| Comparative example | 1 | Ti$_{0.5}$Al$_{0.5}$N | 3 | AlN | AlP | 7500 | Hexagonal | 1.2 | 1700 | −1.4 | TiN | 0.2 | 4.4 |
| | 2 | Ti$_{0.5}$Al$_{0.5}$N | 3 | AlN | CVD | 8700 | Hexagonal | 1.1 | 1400 | 0.2 | TiN | 0.2 | 4.3 |
| | 3 | Ti$_{0.5}$Al$_{0.5}$N | 3 | AlN | SP | 1600 | Hexagonal | 0.8 | 1600 | −0.6 | TiN | 0.2 | 4 |
| | 4 | Ti$_{0.5}$Al$_{0.5}$N | 3 | AlN | SP | 5200 | Hexagonal | 0.8 | 4000 | −1.2 | TiN | 0.2 | 4 |
| | 5 | Ti$_{0.5}$Al$_{0.5}$N | 3 | AlN | SP | 2500 | Hexagonal | 5.5 | 3600 | −0.2 | TiN | 0.2 | 8.7 |
| | 6 | Ti$_{0.5}$Al$_{0.5}$N | 3 | AlN | SP | 2500 | Hexagonal | 0.1 | 3600 | −0.2 | TiN | 0.2 | 3.3 |
| | 7 | Ti$_{0.5}$Al$_{0.5}$N | 3 | AlN | SP | 1400 | Amorphous | 1.3 | 1800 | −0.1 | TiN | 0.2 | 4.5 |

TABLE III

| | | Intermediate layer | | | | | |
|---|---|---|---|---|---|---|---|
| | | First layer | | Second layer | | Third layer | |
| | | Composition | Thickness (μm) | Composition | Thickness (μm) | Composition | Thickness (μm) |
| Example | 29 | Ti$_{0.5}$Al$_{0.5}$N | 3 | — | — | — | — |
| | 30 | Ti$_{0.5}$Al$_{0.5}$N | 3 | — | — | — | — |
| | 31 | Ti$_{0.5}$Al$_{0.5}$N | 3 | — | — | — | — |
| | 32 | Ti$_{0.5}$Al$_{0.5}$N | 3 | — | — | — | — |
| | 33 | Ti$_{0.5}$Al$_{0.5}$N | 3 | — | — | — | — |
| | 34 | Ti$_{0.5}$Al$_{0.5}$N | 0.4 | Al$_{0.7}$Cr$_{0.3}$N | 3.5 | — | — |
| | 35 | Ti$_{0.6}$Al$_{0.4}$N | 0.5 | Ti$_{0.45}$Al$_{0.48}$Si$_{0.07}$N | 3.5 | — | — |
| | 36 | TiN | 0.5 | Ti$_{0.3}$Al$_{0.7}$N | 3.5 | — | — |
| | 37 | Ti$_{0.5}$Al$_{0.5}$N | 0.5 | Ti$_{0.45}$Al$_{0.48}$Si$_{0.07}$N | 3.5 | — | — |
| | 38 | Ti$_{0.5}$Al$_{0.5}$N | 0.5 | Al$_{0.7}$Cr$_{0.3}$N | 2.5 | Ti$_{0.9}$Si$_{0.1}$CN | 1 |
| | 39 | Ti$_{0.6}$Al$_{0.4}$N | 0.5 | Ti$_{0.45}$Al$_{0.48}$Si$_{0.07}$N | 3.5 | — | — |
| | 40 | Ti$_{0.6}$Al$_{0.4}$N | 0.5 | Ti$_{0.45}$Al$_{0.48}$Si$_{0.07}$N | 3.5 | — | — |
| | 41 | Ti$_{0.6}$Al$_{0.4}$N | 0.5 | Ti$_{0.45}$Al$_{0.48}$Si$_{0.07}$N | 3.5 | — | — |
| | 42 | Ti$_{0.6}$Al$_{0.4}$N | 0.5 | Ti$_{0.45}$Al$_{0.48}$Si$_{0.07}$N | 3.5 | — | — |
| | 43 | Ti$_{0.6}$Al$_{0.4}$N | 0.5 | Ti$_{0.4}$Al$_{0.44}$Cr$_{0.08}$Si$_{0.08}$N | 3.5 | — | — |
| | 44 | Ti$_{0.6}$Al$_{0.4}$N | 0.5 | Ti$_{0.45}$Al$_{0.48}$Si$_{0.07}$N | 3.5 | — | — |
| | 45 | Ti$_{0.6}$Al$_{0.4}$N | 0.5 | Ti$_{0.45}$Al$_{0.48}$Si$_{0.07}$N | 3.5 | — | — |
| | 46 | Ti$_{0.6}$Al$_{0.4}$N | 0.5 | Ti$_{0.45}$Al$_{0.48}$Si$_{0.07}$N | 3.5 | — | — |
| | 47 | Ti$_{0.6}$Al$_{0.4}$N | 0.5 | Ti$_{0.45}$Al$_{0.48}$Si$_{0.07}$N | 3.5 | — | — |
| | 48 | Ti$_{0.6}$Al$_{0.4}$N | 0.5 | Ti$_{0.45}$Al$_{0.48}$Si$_{0.07}$N | 3.5 | — | — |
| | 49 | Ti$_{0.6}$Al$_{0.4}$N | 0.5 | Ti$_{0.45}$Al$_{0.48}$Si$_{0.07}$N | 3.5 | — | — |
| | 50 | Ti$_{0.6}$Al$_{0.4}$N | 0.5 | Ti$_{0.45}$Al$_{0.48}$Si$_{0.07}$N | 3.5 | — | — |

TABLE III-continued

| | | | | | | | | |
|---|---|---|---|---|---|---|---|---|
| | 51 | $Ti_{0.6}Al_{0.4}N$ | 0.5 | $Ti_{0.45}Al_{0.48}Si_{0.07}N$ | 3.5 | — | — | |
| | 52 | $Ti_{0.6}Al_{0.4}N$ | 0.5 | $Ti_{0.45}Al_{0.48}Si_{0.07}N$ | 2.5 | $Al_2O_3$ | 0.7 | |
| | 53 | TiN | 0.5 | $Al_{0.7}Cr_{0.3}N$ | 3 | $Al_{0.97}Cr_{0.03}NO$ | 0.3 | |
| | 54 | $Ti_{0.6}Al_{0.4}N$ | 0.5 | $Ti_{0.93}Si_{0.07}N$ (8 nm)/ $Ti_{0.45}Al_{0.48}Si_{0.07}N$ (11 nm) | 3.5 | — | — | |
| | 55 | $Ti_{0.6}Al_{0.4}N$ | 0.5 | TiN (7 nm)/ $Ti_{0.4}Al_{0.48}Si_{0.07}Cr_{0.05}N$ (6 nm) | 3.5 | — | — | |
| | 56 | $Ti_{0.6}Al_{0.4}N$ | 0.5 | TiN (7 nm)/ $Ti_{0.45}Al_{0.48}Si_{0.07}N$ (5 nm)/ $Al_{0.48}Cr_{0.45}Si_{0.07}N$ (5 nm) | 3.5 | — | — | |

| | | | | First coating layer | | | | | |
|---|---|---|---|---|---|---|---|---|---|
| | | | Composition | Production process | Thermal effusivity ($J \cdot sec^{-1} \cdot m^{-1} \cdot K^{-1}$) | Crystal structure | Thickness (μm) | Hardness (mgf/μm) | Residual stress (GPa) | Total thickness (μm) |
| Example | 29 | AlN | AIP | 5000 | Hexagonal | 1 | 1600 | −1.6 | 4 |
| | 30 | AlN | SP | 4700 | Hexagonal | 1 | 2200 | −0.8 | 4 |
| | 31 | AlN | SP | 4200 | Hexagonal | 0.8 | 3400 | −0.2 | 3.8 |
| | 32 | AlN | SP | 3500 | Hexagonal | 0.9 | 3300 | −0.6 | 3.9 |
| | 33 | AlN | SP | 3300 | Hexagonal | 1.2 | 3400 | −0.7 | 4.2 |
| | 34 | AlN | SP | 3000 | Hexagonal | 1 | 3200 | −0.2 | 4.9 |
| | 35 | AlN | SP | 2700 | Hexagonal | 0.7 | 3400 | −0.4 | 4.7 |
| | 36 | AlN | SP | 2600 | Hexagonal | 0.7 | 2700 | −0.6 | 4.7 |
| | 37 | AlN | SP | 2100 | Hexagonal | 1.1 | 3600 | −0.5 | 5.1 |
| | 38 | AlN | SP | 2000 | Hexagonal | 1 | 3500 | −0.2 | 5 |
| | 39 | AlN | SP | 2300 | Hexagonal | 0.2 | 3600 | −0.7 | 4.2 |
| | 40 | AlN | SP | 2100 | Hexagonal | 1.5 | 3600 | −0.3 | 5.5 |
| | 41 | AlN | SP | 2100 | Hexagonal | 1.9 | 3500 | −0.2 | 5.9 |
| | 42 | AlN | SP | 2300 | Hexagonal | 3 | 3500 | −0.2 | 7 |
| | 43 | AlN | SP | 2100 | Hexagonal | 3.7 | 3600 | −0.2 | 7.7 |
| | 44 | AlN | SP | 2000 | Hexagonal | 4.9 | 3600 | −0.3 | 8.9 |
| | 45 | $Al_{0.93}Cr_{0.07}N$ | SP | 3400 | Hexagonal | 1 | 2900 | −0.4 | 5 |
| | 46 | $Al_{0.93}B_{0.07}N$ | SP | 2400 | Hexagonal | 1 | 3000 | −0.2 | 5 |
| | 47 | $Al_{0.94}V_{0.06}N$ | SP | 3000 | Hexagonal | 0.9 | 3000 | −0.6 | 4.9 |
| | 48 | $Al_{0.95}Si_{0.05}N$ | SP | 2300 | Hexagonal | 1 | 3600 | −0.2 | 5 |
| | 49 | $Al_{0.92}Ta_{0.08}N$ | SP | 2200 | Hexagonal | 1 | 3100 | −0.2 | 5 |
| | 50 | $Al_{0.98}Hf_{0.02}N$ | SP | 3100 | Hexagonal | 1.2 | 2900 | −0.5 | 5.2 |
| | 51 | $Al_{0.93}Y_{0.07}N$ | SP | 2700 | Hexagonal | 1 | 3200 | −0.5 | 5 |
| | 52 | AlN | SP | 2200 | Hexagonal | 1 | 3100 | −0.2 | 4.7 |
| | 53 | AlN | SP | 2200 | Hexagonal | 1 | 3100 | −0.2 | 5 |
| | 54 | AlN | SP | 2200 | Hexagonal | 1 | 3100 | −0.2 | 5 |
| | 55 | AlN | SP | 2200 | Hexagonal | 1 | 3100 | −0.2 | 5 |
| | 56 | AlN | SP | 2200 | Hexagonal | 1 | 3100 | −0.2 | 5 |

TABLE IV

| | | Intermediate layer | | First coating layer | | | | | | Outermost layer | | Total |
|---|---|---|---|---|---|---|---|---|---|---|---|---|
| | | Composition | Thickness (μm) | Composition | Production process | Thermal effusivity ($J \cdot sec^{-1} \cdot m^{-1} \cdot K^{-1}$) | Crystal structure | Thickness (μm) | Hardness (mgf/μm) | Residual stress (Gpa) | Composition | Thickness (μm) | thickness (μm) |
| Comparative example | 8 | $Ti_{0.5}Al_{0.5}N$ | 3 | AlN | SP | 4700 | Hexagonal | 1 | 2200 | −0.8 | $Ti_{0.94}Hf_{0.06}CN$ | 1.5 | 5.5 |
| | 9 | $Ti_{0.5}Al_{0.5}N$ | 3 | AlN | SP | 1800 | Hexagonal | 1 | 3000 | −0.2 | — | — | 4 |
| | 10 | $Ti_{0.5}Al_{0.5}N$ | 3 | AlN | SP | 5200 | Hexagonal | 1 | 1700 | −0.2 | — | — | 4 |
| | 11 | $Ti_{0.5}Al_{0.5}N$ | 3 | AlN | CVD | 5500 | Hexagonal | 1 | 5700 | −0.3 | — | — | 4 |
| | 12 | $Ti_{0.5}Al_{0.5}N$ | 3 | AlN | SP | 1200 | Amorphous | 1 | 4900 | −0.1 | — | — | 4 |
| | 13 | $Ti_{0.5}Al_{0.5}N$ | 3 | AlN | SP | 4700 | Hexagonal | 5.5 | 1900 | −0.1 | — | — | 8.5 |
| | 14 | $Ti_{0.5}Al_{0.5}N$ | 3 | AlN | SP | 4700 | Hexagonal | 0.1 | 2200 | −0.9 | — | — | 3.1 |

In Tables I to IV, the "composition" in the columns "first layer," "second layer," and "third layer" shows the compositions of the second coating layers forming the respective layers, and the "thickness" shows the thicknesses of the respective layers. In addition, the second layers of Examples 25 to 28 in Table I and the second layers of Examples 54 to 56 in Table III, which had a supermultilayer structure, were deposited under known conditions to the thicknesses shown in parentheses beside the compositions.

Subsequently, the first coating layers shown in Tables I to IV were formed on the intermediate layers formed as above. The first coating layers were formed so as to have the thicknesses shown in Tables I to IV using sintered or fused targets having the target compositions, that is, the metal compositions of the first coating layers shown in Tables I to IV, while introducing Ar and $N_2$.

In Tables I to IV, the "composition" in the column "first coating layer" shows the compositions of the compounds forming the first coating layers. The "AlN," for example, in Tables I to IV refers to a crystalline or amorphous material composed of aluminum and nitrogen, where the atomic ratio of aluminum to nitrogen is not limited to 1:1, but may deviate slightly therefrom and includes all known atomic ratios; that is, their atomic ratio is not particularly limited. As in the case of AlN above, none of the compositions shown in Tables I to IV is limited in composition ratio.

Furthermore, the "AIP" in the column "production process" indicates that the layer was formed by arc ion plating, the "SP" indicates that the layer was formed by sputtering, and the "CVD" indicates that the layer was formed by a known chemical vapor deposition process. In addition, the column "thickness" shows the thicknesses of the first coating layers. In addition, the column "hardness" shows the indentation hardnesses measured using a nanoindenter hardness tester, and the column "residual stress" shows the average residual stresses of the entire first coating layers.

For the formation of the first coating layer by sputtering, it was formed by raising the deposition temperature to 500° C. and alternately applying a pulse frequency of 100 kHz or less and a pulse frequency of 300 kHz or more to the sputter cathode by controlling the pulse frequency each time a thickness of 20 to 70 nm was reached.

To form a dense crystal structure in the first coating layer, the pulse frequency and bias with which the first coating layer was formed were adjusted. Specifically, when the pulse frequency applied to the sputter cathode was controlled to 100 kHz or less, the bias applied to the substrate was adjusted to a frequency of 200 kHz or more and a bias voltage of 50 V or more, whereas when the pulse frequency applied to the sputter cathode was controlled to 300 kHz or more, the bias applied to the substrate was adjusted to a frequency of 100 kHz or less and a bias voltage of less than 50 V. The sputter power was adjusted so that the deposition rate was 0.1 to 0.6 μm/h.

Subsequently, the outermost layers shown in Tables I, II, and IV were formed on the first coating layers formed as above. In the tables, the symbol "-" in the column showing the compositions of the outermost layers means that no outermost layer was formed. The outermost layers, which can be formed in the same manner as the second coating layers described above, were deposited by a known method using sintered or fused targets having the target compositions, that is, the metal compositions of the outermost layers shown in Tables I, II, and IV, so as to have the thicknesses shown in Tables I, II, and IV.

In Tables I, II, and IV, the "composition" in the column "outermost layer" shows the compositions of the compounds forming the outermost layers, and the column "total thickness" shows the thicknesses of the entire coatings.

Wear Resistance Evaluation of Surface-Coated Cutting Tools

The surface-coated cutting tools, produced as above, of Examples 1 to 56 and Comparative Examples 1 to 14 were each evaluated for wear resistance by a face milling test and a continuous turning test under the following conditions. The evaluation was carried out by measuring, as the cutting time, the time elapsed before the width of flank wear at the cutting edge exceeded 0.2 mm or the time elapsed before the coating fractured. For both the face milling test and the continuous turning test, a longer cutting time indicates superior wear resistance. Examples 1 to 28 and Comparative Examples 1 to 7 and Examples 29 to 56 and Comparative Examples 8 to 14 were evaluated for wear resistance under different conditions, the details of which will be described below. The results are shown in Tables V and VI.

Conditions for Face Milling Test

In Examples 1 to 28 and Comparative Examples 1 to 7, as the substrates, as described above, the face milling indexable inserts formed of a P20 cemented carbide and having the shape of SDEX42MT (JIS) were subjected to the test under the following conditions:

Workpiece: SCM435 (size of machined surface: 300 mm×120 mm)
Cutting speed: 230 m/min
Depth of cut: 2.0 mm
Feed: 0.2 mm/rev
Dry/wet: dry In Examples 29 to 56 and Comparative Examples 8 to 14, on the other hand, as the substrates, as described above, the face milling indexable inserts formed of a P20 cemented carbide and having the shape of SEET13T3AGSN (JIS) were subjected to the test under the following conditions:

Workpiece: SCM435 (size of machined surface: 300 mm×120 mm)
Cutting speed: 300 m/min
Depth of cut: 2.0 mm
Feed: 0.2 mm/rev
Dry/wet: dry Conditions for Continuous Turning Test In Examples 1 to 28 and Comparative Examples 1 to 7, as the substrates, as described above, the turning indexable inserts formed of a P20 cemented carbide and having the shape of CNMG120408 were subjected to the test under the following conditions:

Workpiece: SCM435 round bar
Cutting speed: 200 m/min
Depth of cut: 2.0 mm
Feed: 0.2 mm/rev
Dry/wet: wet In Examples 29 to 56 and Comparative Examples 8 to 14, as the substrates, as described above, the turning indexable inserts formed of a K20 cemented carbide and having the shape of CNMG120408 were subjected to the test under the following conditions:

Workpiece: Inconel 718 round bar
Cutting speed: 70 m/min
Depth of cut: 0.5 mm
Feed: 0.15 mm/rev
Dry/wet: wet

TABLE V

|  |  | Life | |
|---|---|---|---|
|  |  | Face milling | Turning |
| Example | 1 | 31 min. 50 sec. | 18 min. 8 sec. |
|  | 2 | 33 min. 37 sec. | 17 min. 31 sec. |
|  | 3 | 36 min. 59 sec. | 20 min. 24 sec. |
|  | 4 | 37 min. 5 sec. | 21 min. 31 sec. |
|  | 5 | 40 min. 46 sec. | 23 min. 49 sec. |
|  | 6 | 43 min. 4 sec. | 25 min. 26 sec. |
|  | 7 | 41 min. 42 sec. | 24 min. 28 sec. |
|  | 8 | 44 min. 16 sec. | 25 min. 48 sec. |
|  | 9 | 43 min. 57 sec. | 26 min. 46 sec. |
|  | 10 | 42 min. 15 sec. | 24 min. 45 sec. |
|  | 11 | 41 min. 2 sec. | 24 min. 50 sec. |
|  | 12 | 40 min. 48 sec. | 23 min. 17 sec. |
|  | 13 | 40 min. 6 sec. | 23 min. 31 sec. |

TABLE V-continued

| | | Life | |
|---|---|---|---|
| | | Face milling | Turning |
| | 14 | 48 min. 41 sec. | 28 min. 22 sec. |
| | 15 | 45 min. 10 sec. | 26 min. 11 sec. |
| | 16 | 45 min. 31 sec. | 26 min. 44 sec. |
| | 17 | 46 min. 12 sec. | 27 min. 59 sec. |
| | 18 | 46 min. 15 sec. | 27 min. 14 sec. |
| | 19 | 48 min. 27 sec. | 28 min. 29 sec. |
| | 20 | 46 min. 55 sec. | 26 min. 48 sec. |
| | 21 | 48 min. 7 sec. | 28 min. 50 sec. |
| | 22 | 42 min. 41 sec. | 24 min. 43 sec. |
| | 23 | 43 min. 27 sec. | 25 min. 40 sec. |
| | 24 | 42 min. 24 sec. | 24 min. 4 sec. |
| | 25 | 50 min. 11 sec. | 29 min. 39 sec. |
| | 26 | 52 min. 51 sec. | 32 min. 37 sec. |
| | 27 | 52 min. 46 sec. | 31 min. 31 sec. |
| | 28 | 51 min. 12 sec. | 30 min. 7 sec. |
| Comparative example | 1 | 15 min. 43 sec. | 7 min. 34 sec. |
| | 2 | 13 min. 8 sec. | 4 min. 47 sec. |
| | 3 | 19 min. 16 sec. | 10 min. 13 sec. |
| | 4 | 17 min. 53 sec. | 8 min. 39 sec. |
| | 5 | 22 min. 32 sec. | 12 min. 10 sec. |
| | 6 | 20 min. 13 sec. | 12 min. 26 sec. |
| | 7 | 13 min. 19 sec. | 5 min. 31 sec. |

TABLE VI

| | | Life | |
|---|---|---|---|
| | | Face milling | Turning |
| Example | 29 | 12 min. 51 sec. | 24 min. 46 sec. |
| | 30 | 12 min. 48 sec. | 28 min. 37 sec. |
| | 31 | 14 min. 19 sec. | 30 min. 45 sec. |
| | 32 | 17 min. 29 sec. | 35 min. 52 sec. |
| | 33 | 18 min. 9 sec. | 33 min. 23 sec. |
| | 34 | 19 min. 4 sec. | 34 min. 16 sec. |
| | 35 | 20 min. 3 sec. | 35 min. 3 sec. |
| | 36 | 14 min. 16 sec. | 30 min. 58 sec. |
| | 37 | 18 min. 56 sec. | 33 min. 25 sec. |
| | 38 | 18 min. 8 sec. | 33 min. 18 sec. |
| | 39 | 17 min. 52 sec. | 31 min. 41 sec. |
| | 40 | 18 min. 54 sec. | 33 min. 22 sec. |
| | 41 | 17 min. 34ec. | 32 min. 17 sec. |
| | 42 | 16 min. 46 sec. | 30 min. 23 sec. |
| | 43 | 15 min. 33 sec. | 29 min. 24 sec. |
| | 44 | 15 min. 5 sec. | 28 min. 43 sec. |
| | 45 | 21 min. 21 sec. | 36 min. 1 sec. |
| | 46 | 21 min. 44 sec. | 36 min. 51 sec. |
| | 47 | 21 min. 40 sec. | 36 min. 19 sec. |
| | 48 | 22 min. 17 sec. | 38 min. 6 sec. |
| | 49 | 21 min. 48 sec. | 35 min. 47 sec. |
| | 50 | 21 min. 35 sec. | 37 min. 8 sec. |
| | 51 | 22 min. 34 sec. | 38 min. 14 sec. |
| | 52 | 15 min. 27 sec. | 30 min. 34 sec. |
| | 53 | 14 min. 18 sec. | 30 min. 54 sec. |
| | 54 | 24 min. 3 sec. | 39 min. 35 sec. |
| | 55 | 25 min. 52 sec. | 41 min. 47 sec. |
| | 56 | 27 min. 45 sec. | 40 min. 30 sec. |
| Comparative example | 8 | 7 min. 58 sec. | 12 min. 10 sec. |
| | 9 | 6 min. 6 sec. | 11 min. 44 sec. |
| | 10 | 5 min. 50 sec. | 10 min. 53 sec. |
| | 11 | 36 sec. | 5 min. 15 sec. |
| | 12 | 6 min. 30 sec. | 8 min. 16 sec. |
| | 13 | 2 min. 26 sec. | 8 min. 34 sec. |
| | 14 | 6 min. 31 sec. | 11 min. 9 sec. |

As is obvious from Table V, the surface-coated cutting tools of Examples 1 to 28 according to the present invention had a higher wear resistance than the surface-coated cutting tools of Comparative Examples 1 to 7, demonstrating that the tool life was improved.

Similarly, as is obvious from Table VI, the surface-coated cutting tools of Examples 29 to 56 according to the present invention had a higher wear resistance than the surface-coated cutting tools of Comparative Examples 8 to 14, demonstrating that the tool life was improved.

While embodiments and examples of the present invention have been described above, it is intended from the beginning that the configurations of the above embodiments and examples be appropriately combined.

The embodiments and examples disclosed herein should be construed as illustrative, rather than as limiting, in all respects. The scope of the present invention is defined by the claims, rather than by the above description, and it is intended that all modifications within the meaning and scope of the claims and equivalents thereof be included.

The invention claimed is:

1. A surface-coated cutting tool comprising a substrate and a coating formed on the substrate, wherein:
   the coating is formed by physical vapor deposition and includes one or more layers;
   at least one of the one or more layers is a first coating layer; and
   the first coating layer contains aluminum and nitrogen, has a thermal effusivity of 2,000 to 5,000 $J \cdot sec^{1/2} \cdot m^{-2} \cdot K^{-1}$, has a thickness of 0.2 to 5 μm, and has a crystal structure including a hexagonal structure.

2. The surface-coated cutting tool according to claim 1, wherein the first coating layer is an outermost layer of the coating.

3. The surface-coated cutting tool according to claim 1, wherein the first coating layer has a hardness of 2,500 to 3,800 mgf/μm2.

4. The surface-coated cutting tool according to claim 1, wherein the first coating layer has a residual stress of −1 to 0 GPa.

5. The surface-coated cutting tool according to claim 1, wherein the first coating layer is formed by sputtering.

6. The surface-coated cutting tool according to claim 1, wherein the first coating layer comprises $Al_{1-x}Me_xN$ ($0.001 \leq x \leq 0.2$),
   where Me is one or more elements selected from the group consisting of vanadium, chromium, yttrium, niobium, hafnium, tantalum, boron, and silicon.

7. The surface-coated cutting tool according to claim 1, wherein the coating includes one or more second coating layers in addition to the first coating layer,
   the second coating layers comprising one or more elements selected from the group consisting of group IVa, Va, and VIa elements of the periodic table, aluminum, and silicon, or a compound of one or more of the elements with one or more elements selected from the group consisting of carbon, nitrogen, oxygen, and boron.

8. The surface-coated cutting tool according to claim 7, wherein one or more of the second coating layers comprise one or more elements selected from the group consisting of chromium, aluminum, titanium, and silicon or a compound of one or more of the elements with one or more elements selected from the group consisting of carbon, nitrogen, oxygen, and boron.

9. The surface-coated cutting tool according to claim 7, wherein the second coating layers have a supermultilayer structure including periodically stacked thin-film layers having a thickness of 1 to 100 nm,
   the thin-film layers comprising one or more elements selected from the group consisting of chromium, aluminum, titanium, and silicon or a compound of one or more of the elements with one or more elements selected from the group consisting of carbon, nitrogen, oxygen, and boron.

10. The surface-coated cutting tool according to claim 1, wherein the substrate comprises a cemented carbide, a cermet, a sintered cubic boron nitride compact, a high-speed steel, a ceramic, or a sintered diamond compact.

11. The surface-coated cutting tool according to claim 2, wherein the first coating layer has a hardness of 2,500 to 3,800 mgf/μm2.

12. The surface-coated cutting tool according to claim 2, wherein the first coating layer has a residual stress of −1 to 0 GPa.

13. The surface-coated cutting tool according to claim 3, wherein the first coating layer has a residual stress of −1 to 0 GPa.

14. The surface-coated cutting tool according to claim 2, wherein the first coating layer is formed by sputtering.

15. The surface-coated cutting tool according to claim 3, wherein the first coating layer is formed by sputtering.

16. The surface-coated cutting tool according to claim 2, wherein the first coating layer comprises $Al_{1-x}Me_xN$ ($0.001 \leq x \leq 0.2$),
where Me is one or more elements selected from the group consisting of vanadium, chromium, yttrium, niobium, hafnium, tantalum, boron, and silicon.

17. The surface-coated cutting tool according to claim 2, wherein the coating includes one or more second coating layers in addition to the first coating layer,
the second coating layers comprising one or more elements selected from the group consisting of group IVa, Va, and VIa elements of the periodic table, aluminum, and silicon, or a compound of one or more of the elements with one or more elements selected from the group consisting of carbon, nitrogen, oxygen, and boron.

18. The surface-coated cutting tool according to claim 17, wherein one or more of the second coating layers comprise one or more elements selected from the group consisting of chromium, aluminum, titanium, and silicon or a compound of one or more of the elements with one or more elements selected from the group consisting of carbon, nitrogen, oxygen, and boron.

19. The surface-coated cutting tool according to claim 18, wherein the second coating layers have a supermultilayer structure including periodically stacked thin-film layers having a thickness of 1 to 100 nm,
the thin-film layers comprising one or more elements selected from the group consisting of chromium, aluminum, titanium, and silicon or a compound of one or more of the elements with one or more elements selected from the group consisting of carbon, nitrogen, oxygen, and boron.

20. The surface-coated cutting tool according to claim 2, wherein the substrate comprises a cemented carbide, a cermet, a sintered cubic boron nitride compact, a high-speed steel, a ceramic, or a sintered diamond compact.

* * * * *